United States Patent [19]
Schiller et al.

[11] Patent Number: 5,227,911
[45] Date of Patent: Jul. 13, 1993

[54] MONOLITHIC TOTAL INTERNAL REFLECTION OPTICAL RESONATOR

[75] Inventors: Stephan Schiller, Varese, Italy; Martin M. Fejer, Menlo Park, Calif.; Andreas Sizmann, Munich, Fed. Rep. of Germany; Robert L. Byer, Stanford, Calif.

[73] Assignee: The Board of Trustees of the Leland Stanford, Jr. University, Stanford, Calif.

[21] Appl. No.: 843,132

[22] Filed: Feb. 28, 1992

[51] Int. Cl.⁵ .......................................... G02B 26/08
[52] U.S. Cl. .................................. 359/222; 359/211; 359/213; 359/328; 372/22; 372/92; 372/94
[58] Field of Search ............... 359/222, 261, 328, 317, 359/322, 323, 213, 211; 372/21, 22, 10, 66, 92, 93, 94, 95, 108

[56] References Cited

U.S. PATENT DOCUMENTS

| | | | |
|---|---|---|---|
| 4,563,763 | 1/1986 | Kuhn | 372/35 |
| 4,617,669 | 10/1986 | Kuhn | 372/70 |
| 4,641,970 | 2/1987 | Gustafson et al. | 372/94 |
| 4,785,459 | 11/1988 | Baer | 372/75 |
| 4,829,537 | 5/1989 | Baer | 372/66 |
| 4,924,476 | 5/1990 | Behrar-Rad et al. | 372/94 |
| 4,955,034 | 9/1990 | Scerbak | 372/94 |
| 5,007,065 | 4/1991 | Trutna, Jr. | 372/94 |
| 5,027,361 | 6/1991 | Kozlovsky et al. | 372/22 |
| 5,095,491 | 3/1992 | Kozlovsky et al. | 372/94 |

OTHER PUBLICATIONS

Baer, T., "Continuous-wave laser oscillation in a Nd:YAG sphere", Optics Letters, vol. 12, No. 6, Jun. 1987, pp. 392-394.
Behfar-Rad, et al., "Etched-facet AlGaAs triangular--shaped ring lasers with output coupling", Appl. Phys. Lett. 59(12), 16 Sep. 1991, pp. 1395-1397.
Court, et al., "Frustrated Total Internal Reflection and Application of Its Principle to Laser Cavity Design", Applied Optics, vol. 3, No. 6, Jun. 1964, pp. 719-726.
Castleberry, Donald Earl, "Energy transfer in sensitized rare earth lasers", MIT Technical Report No. 19, Sep., 1975.
Hull, et al., "Interference-enhanced frustrated total internal reflection", J.Opt.Soc.Am., vol. 70, No. 1, Jan. 1980, pp. 17-28.
Marowsky, et al., "A Comparative Study of Dye Prism Ring Lasers", IEEE J. Quantum Electron., vol. QE-10, No. 11, Nov. 1974, pp. 832-837.
Oku, et al., "Low-Threshold CW Operation of Square-Shaped Semiconductor Ring Lasers (Orbiter Lasers)", IEEE Photonics Technology Letters, vol. 3, No. 7, Jul. 1991, pp. 588-590.
Steele, et al., "A Laser Output Coupler Using Frustrated Total Internal Reflection", Applied Optics, vol. 5, No. 1, Jan. 1966, pp. 5-8.

*Primary Examiner*—Loha Ben
*Attorney, Agent, or Firm*—Flehr, Hohbach, Test, Albritton & Herbert

[57] ABSTRACT

The combination of a resonator having total internal reflection with a coupler providing coupling via frustrated total internal reflection. Both linear and non-linear embodiments are described. The linear embodiment is a spectrum analyzer. The non-linear embodiment is a second harmonic generator, although modifications are described for turning the same into an optical parametric oscillator.

27 Claims, 3 Drawing Sheets

MONOLITHIC TOTAL INTERNAL REFLECTION OPTICAL RESONATOR

This invention was made with United States Government support under National Science Foundation Grant, PHY-89-13017. The federal government may have rights in and to patents on this invention.

BACKGROUND OF THE INVENTION

This invention relates to optical resonators and instruments incorporating the same and, more particularly, to an optical resonator having a high Finesse.

An optical resonator basically is a device which supports circulation, e.g., oscillation, of optical radiation in a sustaining fashion. That is, in a stable resonator every time optical radiation returns in space to a particular point when enough power is supplied to overcome decay due to internal losses, the phase and amplitude of the radiation are the same as the previous occasion. In this way, when a stable resonator is driven for a time longer than the circulation time, amplitude constructive interference occurs with consequent strong coupling between the driving mechanism and the resonator. This constructive interference is called resonance. (The term "optical radiation", as used herein, means electromagnetic radiation in the visible wavelength spectrum and in other adjacent wavelength spectrums—typically radiation having a wavelength in the range of between 10 and 15,000 nm.)

An optical resonator is a major component of many different optical devices. For example, the lasing cavity of a laser is, in essence, an optical resonator—lasing is amplification and oscillation of optical radiation between reflective surfaces in a resonant fashion. A swept-tuned spectrum analyzer also utilizes a resonator capable of frequency tuning. Second harmonic generators, optical parametric oscillators, and other non-linear optical converters represent other instruments which can make usage of resonators. The applications of resonators are quite wide-ranging.

Often one of the dominant goals in designing resonators for most instruments is to provide as high a Finesse (or a high quality factor) as is practical. The Finesse of a particular resonator typically is deduced from measurements taken on the resonator. (Finesse can, of course, also be estimated.) It can be thought of as a measurement of efficiency, i.e., the enhancement of the optical power of the resonant field compared to the power fed into the resonator.

SUMMARY OF THE INVENTION

The present invention is a resonator design which provides high Finesse and results in simplicities and efficiencies in many of the applications now using conventional resonators. Moreover, it provides high Finesse operation over a wide spectral range. It extends the application of resonator instruments and makes new applications and instruments possible. In broad terms, the high Finesse, broadband resonator of the invention includes the combination of a block of solid-state material which supports the circulation of a Gaussian beam of optical radiation by total internal reflection without the use of coatings, and one or more input and/or output coupling devices providing coupling to the block via frustrated total internal reflection for such Gaussian beam circulation. The term Gaussian beam as used herein is intended to include beams which deviate from an exact Gaussian $TEM_{nmq}$ mode due to thermal effects in the resonator. The material of the block can be selected to be substantially linear, i.e., its dielectric constant is substantially independent of the electric field of the optical wave within the material, or non-linear. The desired total internal reflection (TIR) in the interior of the block is obtained by assuring that the angles of incidence of one or more modes of the Gaussian beam within the block are larger than the critical angle determined by the indices of refraction of the material of the block defining the reflecting facets and that of the ambient medium within which such facets are located. This total internal reflection is frustrated for such coupling via the principles described, for example, in the paper "Frustrated Total Internal Reflection and Application of its Principle to Laser Cavity Design" by I. N. Court et al. appearing in Vol. 3 of *Applied Optics*, page 719 (1964).

A Gaussian beam is a beam of optical radiation which is defined by Gaussian modes of differing orders. Gaussian modes are solutions of the paraxial wave equation in a region of space having a homogenous index of refraction, delimited by a finite number of curved surfaces with radii of curvature satisfying certain requirements. Most lasers emit Gaussian beams because their resonators support Gaussian modes.

The elimination of coatings eliminates the damage problems and operating restrictions typically associated with the same, e.g., limited temperature range. The invention also provides operation with high Finesse over a wide spectral range. The reflectivity (R) of a TIR "mirror" for an angle of incidence $\theta$ sufficiently larger than the critical angle, is in general less than unity, due to scattering of the optical wave by surface imperfections, such as surface roughness. It can be estimated by the expression:

$$R \approx 1 - (4\pi\sigma \cos \theta/\lambda)^2$$

where:
$\sigma$ = r.m.s. surface roughness,
$\lambda$ = wavelength.

With present-day surface polishes ($\sigma \approx 0.1$ nm), reflectivities ($R \approx 1 - 10^{-6}$), comparable to the best coated mirrors, can be obtained. Thus, the losses associated with the reflectivity at the resonator faces can be kept low, and the Finesses of the resonator, which Finesse is inversely proportional to the total losses, can attain large values when a resonator material having low bulk loss is used.

Coupling via frustrated total internal reflection provides the necessary input and output coupling of radiation into or from a desired Gaussian mode of a particular order, e.g., $TEM_{nmq}$, without introducing other orders. Moreover, the combination of frustrated internal reflection with a monolithic internally reflecting resonator is important because coupling can be achieved without significantly reducing the Finesse of the resonator.

The combination also most desirably includes means for varying the distance between the coupler and the block to correspondingly vary the optical coupling therebetween. This makes impedance matching possible. That is, one can make the coupling losses equal the resonator's intrinsic losses. Moreover, if desired, undercoupling and overcoupling can be achieved.

At least one of the facets of the block also most desirably is slightly convex to ensure the stability of the resonator modes of low power Gaussian beams. The curvature radii of the curved surface(s) are functions of the resonator dimensions.

Because of its attractiveness, others have used total internal reflection in the past. Reference is made, for example, to U.S. Pat. No. 4,829,537, Baer, and the Baer paper entitled "Continuous-wave laser oscillation in a Nd:YAG sphere" appearing in Vol. 12 of *Optics Letters* on page 392 (1987). The laser disclosed by Baer is a spherical laser which supports spherical modes whose radial dependence is described by Bessel functions rather than Gaussian beam modes. Disclosure of a spherical laser utilizing total internal reflection does not make obvious the advantages of the use of total internal reflection in a polygonal resonator, particularly the combination of the same with coupling via frustrated total internal reflection. For one thing, it is difficult to efficiently couple Gaussian modes into a spherical mode. Inefficient mode coupling is detrimental particularly in non-linear devices. Also, it is quite difficult to achieve single transverse mode excitation of a spherical resonator by a Gaussian beam. It is also difficult to obtain the smooth surface finish on a sphere needed for obtaining high Finesse with a total internal reflection spherical resonator.

A 1975 thesis prepared by a student at MIT (ENERGY TRANSFER IN SENSITIZED RARE EARTH LASERS by Donald Earl Castleberry) describes a resonator employing total internal reflection of plane waves and coupling via frustrated total internal reflection. This thesis does not mention total internal reflection of Gaussian modes. Efficient devices cannot be made with plane wave total internal reflection resonators by the author because of the weak confinement (diffraction losses) of the plane waves as discussed.

Total internal reflection has also been used with a small, low power semiconductor laser as described in U.S. Pat. No. 4,924,476. The optical radiation is confined in a triangular ring path by what are, in essence, waveguides and, most importantly, frustrated total internal reflection is not utilized for coupling. This disclosure simply does not make it obvious that a high Finesse can be achieved with an uncoated polygonal block when frustrated total internal reflection is utilized for coupling, nor that mode order selection can be maintained or that resonator impedance matching can be achieved with such combination.

Other features and advantages of the invention either will become apparent or will be described in connection with the following, more detailed description of preferred embodiments of the invention.

BRIEF DESCRIPTION OF THE DRAWINGS

With reference to the accompanying three sheets of drawing.

DESCRIPTION OF THE PREFERRED EMBODIMENT(S)

The following relatively detailed description is provided to satisfy the patent statutes. However, it will be appreciated by those skilled in the art that various changes and modifications can be made without departing from the invention as defined by the claims and their equivalents.

Figure 1:
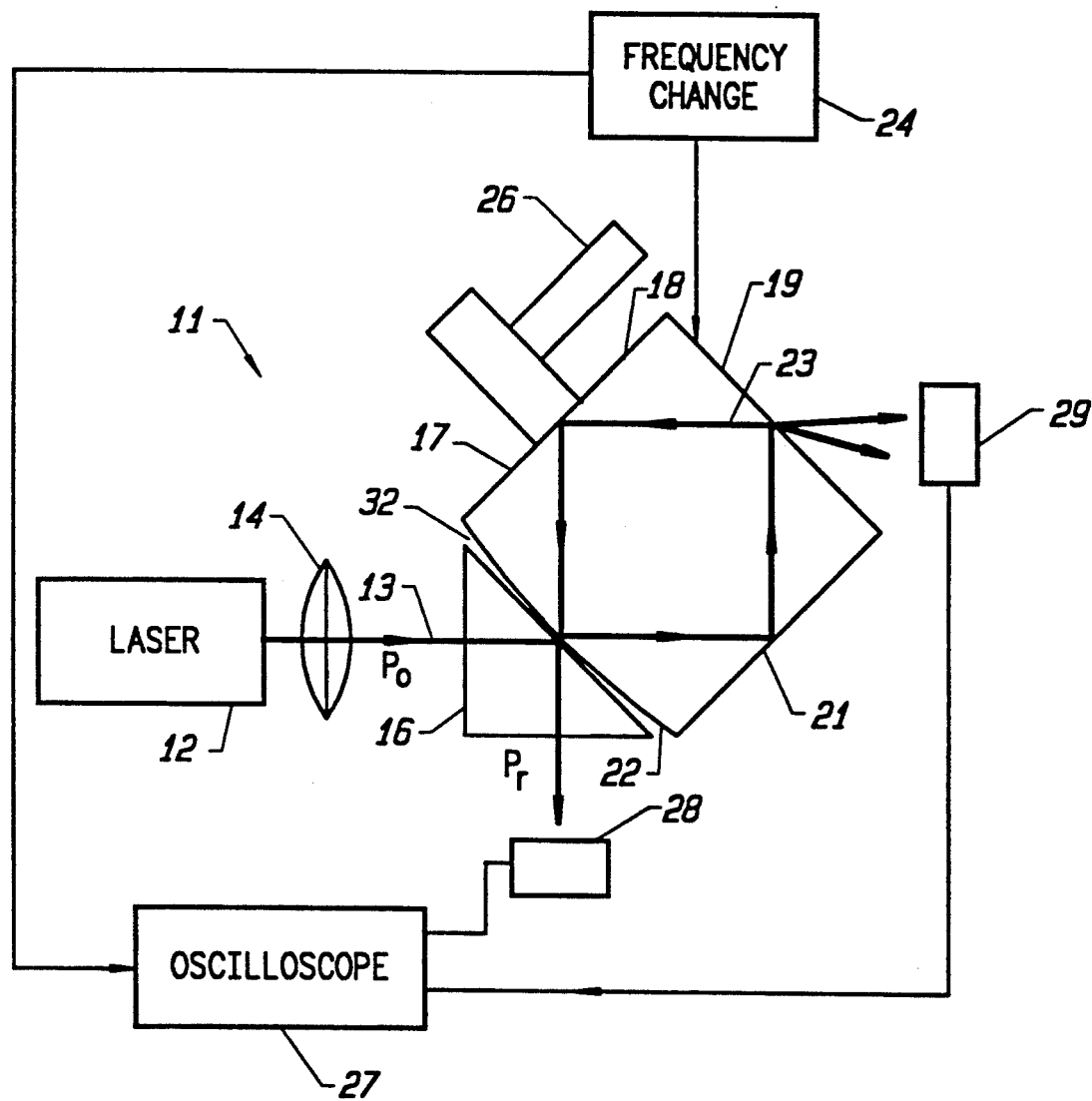
FIG. 1 is a diagrammatic view of a spectrum analyzer providing a preferred embodiment of the instant invention.

A spectrum analyzer having a resonator in accordance with the invention is generally referred to in FIG. 1 by the reference numeral 11. Means are provided for supplying optical radiation to be analyzed. That is, a laser 12 is included which provides an output beam 13 of optical radiation having at least one unknown frequency component.

Such beam is focused as represented by lens 14 through an input/output coupling prism 16 into a polygonal block 17 of solid state material shaped to confine input radiation as Gaussian modes. The solid state material of the block 17 is fused silica. Such block includes a plurality of facets 18-22 which are polished as will be described to provide total internal reflection of Gaussian modes of the radiation within the block. That is, these facets are angled relative to one another to provide angles of incidence for the Gaussian modes larger than the critical angle for the optical radiation defining such Gaussian modes. Moreover, criteria are selected to minimize the excitation of other modes within the block. To achieve excitation only in the $TEM_{ooq}$ mode, the focusing provided by lens 14 must be accomplished according to well-known mode-matching principles. In the calculation of the focusing parameters for the input beam, the frustrated total internal reflection element can be replaced by simple transmission through a curved interface.

As illustrated, the facet 22 is slightly curved in the convex direction, i.e., outwardly relative to the remainder of the block. The purpose of this curvature is to provide low diffraction loss Gaussian eigenmodes. As mentioned previously, the radius of curvature is dependent on the dimensions of the block. In one embodiment in which the block 17 had dimensions of 5 by 5 mm in the ring plane (4 mm height), providing a nominally square ring path with a free spectral range of 14.6 gigahertz, the face 22 was polished with a 13.5 mm radius of curvature. This yielded in-plane and out-of-plane beam widths of 35 micrometers and 46 micrometers, respectively, for the $TEM_{ooq}$ mode of the Gaussian beam when the wavelength was 1.06 micrometers.

It should be noted that while in this embodiment the beam path in the block represented at 23 is nonintersecting and generally planar, it could also be intersecting and/or nonplanar.

Means are provided for changing, e.g., sweeping, the resonance frequency of the Gaussian modes which can be supported within the block. Such means, represented at 24, can provide the desired scanning thermally, elasto-optically, piezoelectrically or electro-optically as examples. Thus, the frequencies of the laser output beam can be detected to identify the unknown frequency (modulo the free spectral range). Either or both photodetectors 28 or 29 can be used as the detecting photodiode to detect resonance excitation within the block, and the signal is displayed on oscilloscope 27 as intensity vs. resonator frequency. In this connection, photodetector 29 detects light scattered from the reflective facet 19 because of surface roughness. It is to be noted that the coupler 16 acts both as the input coupler for the block 17 and as an output coupler to feed radiation to photodiode 28. Use of photodiode 29 as the detecting diode eliminates the background laser power component present in the signal detected by photodiode 28.

Means are included for varying the distance between the coupler 16 and facet 22 to correspondingly vary the optical coupling therebetween. Such means, generally represented in FIG. 1 by the reference numeral 26, can take the form of a piezoelectric translator for the block 17. The block is moved back and forth by the translator 26 to correspondingly change the width of the gap 32 between the coupler prism 16 and the block 17. Thus, impedance matching, overcoupling and undercoupling can be achieved by varying the value of frustrated total internal reflection transmission relative to resonator losses. It should be noted that in some situations such means will either not be included or not be used. In other instruments, the gap can be rapidly changed to correspondingly rapidly change the input/output coupling. This could be used to produce strong pulses when optical energy stored in the resonator is discharged, similar to Q-switching of lasers. The coupling can be changed by, for example, changing the index of refraction of the coupling block (e.g., using liquid crystals), the gap medium, the resonator or by a combination thereof.

Figure 2:
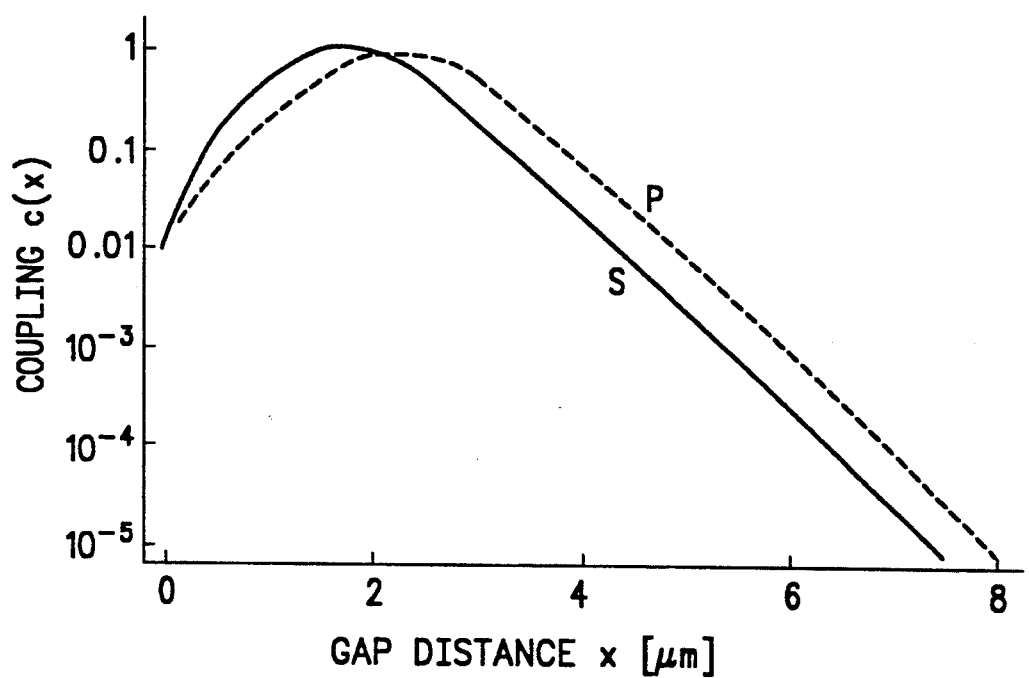
FIG. 2 is a graph of the coupling c(x) of the s- and p-polarized $TEM_{oo}$ Gaussian modes at various distances between the I/O coupler and block of solid state material of the embodiment of FIG. 1.

In one arrangement, the resonator response as a function of frequency and gap was studied. The output beam of a single frequency laser was polarized at 45 degrees and slowly thermally scanned over the s- and p-polarized resonances. FIG. 2 is a graph of the experimentally measured coupling c(x) for various distances between the coupler and the block. The coupling is defined as follows:

$$c(x) = 1 - \frac{P_r(v_r, x)}{P_o}$$

where:
- $P_o$ = incident power;
- $P_r$ = reflected power;
- $v_r$ = resonance frequency;
- $x$ = distance between the block and the coupler.

The experimental measurements match the approximate theoretical expression for such relationship. Such theoretical expression is:

$$c(x) \approx \cosh^{-2}[b(x - x_m)]$$

where:
- $b$ = inverse decay length of the evanescent wave in the gap between prism 16 and block 17; and
- $x_m$ = the gap distance defined as $$\frac{\ln(4 \sin \gamma_1 \sin \gamma_3 / \alpha)}{2b}$$

where
- $\gamma_1$ = total internal reflection phase shift in block 17 at the block entry point;
- $\gamma_3$ = total internal phase shift in the coupler; and
- $\alpha$ = the total loss within block 17.

Impedance matching is achieved when the coupling is at a maximum as illustrated.

As mentioned previously, the facets 18–22 of the block 17 are polished to provide the total internal reflection of a Gaussian beam that is required. This polishing includes polishing each to the finish necessary to provide a total surface scattering loss for a selected frequency of the Gaussian beam that is less than the intrinsic absorption at such frequency. The facet 22 is convexly curved as described earlier to enhance the stability of the resonator modes of the Gaussian beam oscillating within the block.

Figure 3:
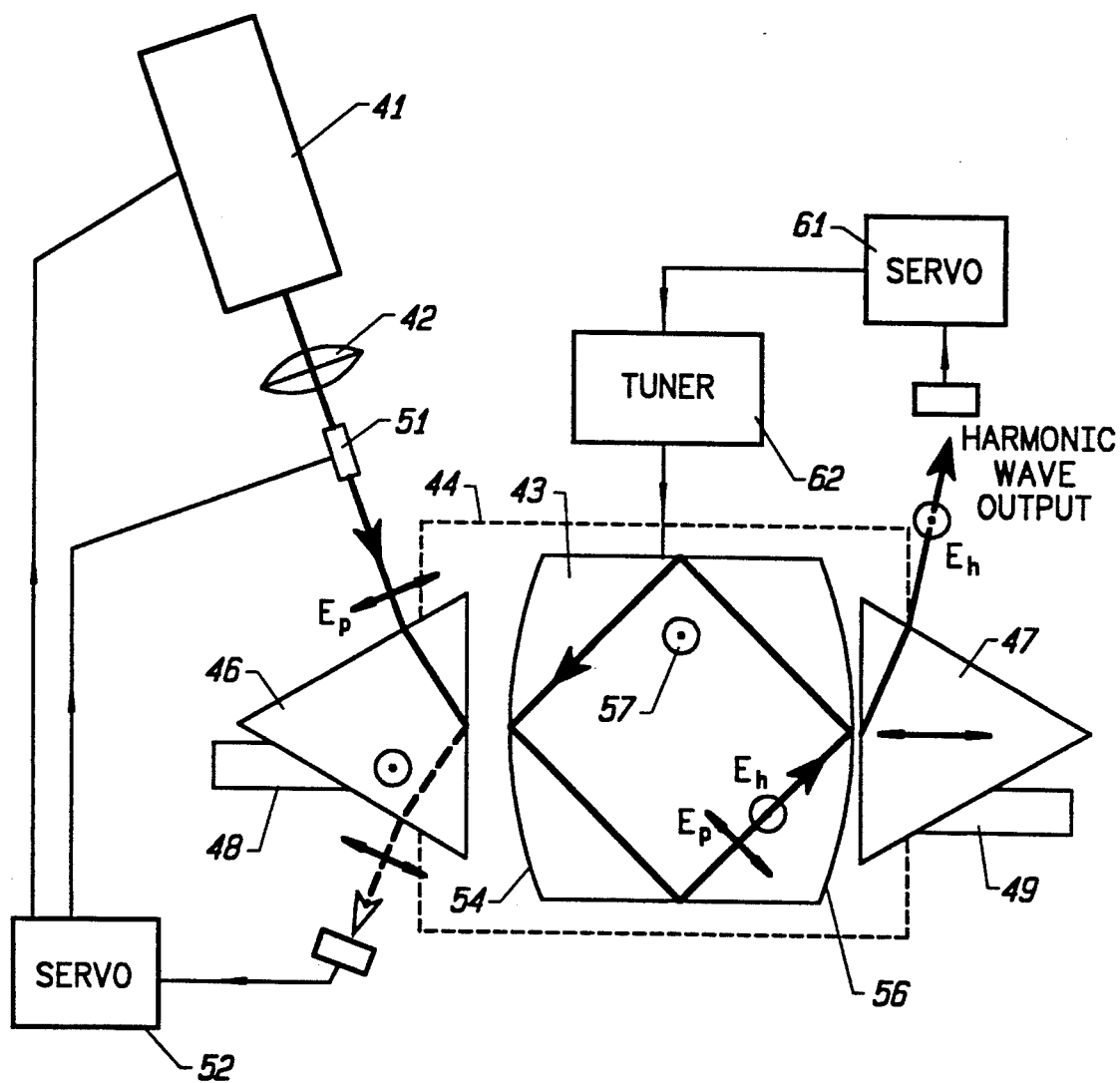
FIG. 3 is a diagrammatic view of a second harmonic generator exemplary of a non-linear device incorporating the instant invention.

FIG. 3 shows a resonant second harmonic generator incorporating the invention. It includes a pump laser 41 with modematching optics represented at 42. The resonator block 43 itself is placed inside an oven schematically represented at 44. The positions of an input/output coupling prism 46 and an output coupling prism 47 are controlled by actuators represented at 48 and 49, respectively. Apparatus comprising a modulator represented at 51 and a servo system represented at 52 is provided for frequency-locking the pump laser to a resonance frequency of the resonator. The resonator is configured to support a Gaussian mode circulating in a planar square ring. The stability of the resonator mode is assured by the two convexly curved faces 54 and 56.

In a particular implementation of this embodiment, the resonator 43 is made from a magnesium oxide doped lithium niobate (MgO:LiNbO$_3$) crystal for doubling a pump wave of wavelength $\lambda = 1.06$ µm. The c-axis of the crystal is normal to the plane of the drawing as is represented at 57. The polarization of the pump wave (electric field vector $E_p$) is normal to the crystal c-axis (ordinary polarization), for non-critical type-I phase-matching. The oven 44 provides heating of the crystal to the phasematching temperature, e.g. 100° C. The polarization of the second harmonic wave (electric field vector $E_h$) is parallel to the c-axis of the resonator crystal (extraordinary polarization).

The coupling prisms 46 and 47 are made of calcite (CaCO$_3$) and the crystal axes are oriented as shown. With this arrangement, prism 46 acts as an input/output coupler for the in-plane polarized pump wave, since for the pump the total internal reflection at the interface between coupler 46 and the resonator face 54 is frustrated. Coupler 46, however, does not couple out any of the harmonic wave generated inside the resonator, since the index of refraction of the extraordinary wave ($n_e$) in calcite ($n_e = 1.48$) is too small to frustrate total internal reflection of the harmonic wave.

Prism 47, on the other hand, serves as an output coupler for the second harmonic wave only, since the index of the second harmonic (ordinary) wave in calcite 28 is $n_o = 1.64$. The pump wave is totally internally reflected at the interface between face 56 and such coupling prism 47.

The gap between the prism 46 and the face 54 is adjusted, as a function of power level of the pump, so that the resonator is impedance matched and the conversion efficiency (ratio of harmonic wave output power to pump input power) is maximized.

The device of the figure can operate in two modes. First, as a device in which only the fundamental wave is kept in resonance with a cavity mode, through the frequency-lock circuit provided by the modulator 51 and the servo system 52. The prism 47 is placed essentially in contact with the resonator block 43. The harmonic wave is then almost completely coupled out, apart from Fresnel reflection at the interface between the resonator 43 and the prism 47.

A second scheme allows one to operate the device as a doubly-resonant second harmonic generator, using the fact that the total internal reflections inside the resonator are broadband. The harmonic wave is brought in resonance in this case, by tuning the resonator (e.g., electro-optically, piezo-electrically, thermally or by pressure) and the pump wave. The output coupling prism 47 is moved away from the resonator in this situation to a distance to maximize output power in the harmonic wave.

Several variations and generalizations of this scheme will be obvious to one skilled in the field. For example, this same device can be used, by changing the phase-matching temperature appropriately, to generate second-harmonic radiation of lasers of different wavelengths; e.g., at about 350° C., $MgO:LiNbO_3$ can frequency-double radiation of wavelength $\lambda = 1.32$ μm.

A further use of this device is as an Optical Parametric Oscillator (OPO). Referring again to the figure, if the pump has a frequency $V_p$, the device will generate signal and idler output waves of frequencies $V_s$, $V_i$, such that $V_s + V_i = V_p$. The actual value of $V_s$ and $V_i$ is determined by the temperature of the resonator crystal and other tuning parameters, such as electric fields and the pressure applied to the resonator block. At the temperature of 110° C. and $\lambda_p = 532$ nm, for example, the device is a degenerate OPO, with output at $\lambda_s \approx \lambda_i \approx 1.064$ μm. It should be noted that the axis orientations of the couplers and wave polarizations should be interchanged when the device is an OPO. For operation as a doubly resonant OPO, a servo 61 acts on the pump laser frequency and a resonator tuning control represented at 62, to keep the signal and idler waves in resonance with the resonator, and coupler 46 is essentially brought in contact with the resonator while the gap between coupler 47 and the resonator is adjusted for maximum power in the signal or idler wave.

All the applications described and variations thereof, make use of: (1) the high reflectivity provided by the use of total internal reflection when the surfaces of the resonator are well polished; (2) the wavelength independence of the effect (3) the use of low-bulk loss materials; and (4) the perfect impedance matching made possible by frustration coupling. The non-linear resonator arrangements thus exhibit high Finesse, which leads to high conversion efficiencies for harmonic generation and low threshold powers for OPOs.

As mentioned at the beginning of the detailed description, Applicant is not limited to the specific embodiment described above. Various changes and modifications that can be made will occur to those skilled in the art. While the specific embodiments which are described respectively are a spectrum analyzer and a second harmonic generator, it will be appreciated by those skilled in the art that the resonator of the invention is useful in many different environments. The coupler also could be of a liquid (e.g., liquid crystal) material and/or an electro-optic material. Moreover, one could obtain wavelength and/or polarization selective input/output coupling using dispersive couplers and/or birefringent and/or dispersive gap materials. It also should be noted that the reflective facet of any coupler can be convexly curved to simplify coupling to a plane facet of the resonator block. It is also contemplated that the solid block of material be made up of two or more different materials. The claims, their equivalents and their equivalent language define the scope of protection.

What is claimed is:

1. A monolithic resonator comprising:
   (a) means defining a block of a solid-state medium for resonating optical radiation having at least three facets for supporting optical radiation as a Gaussian beam internally of said block, the material of said block at said facets having an index of refraction selected relative to the index of refraction of the medium within which the facets are to be located to cause total internal reflection of a Gaussian beam; and
   (b) coupling means positioned adjacent said block for transmission of a beam of optical radiation between said coupling means and said block via frustrated total internal reflection.

2. The monolithic resonator of claim 1 wherein said block generally has a polyhedral shape providing a ring path for a Gaussian beam.

3. The monolithic resonator of claim 1 further including means for varying the distance between said block and said coupling means to correspondingly vary the optical coupling therebetween.

4. The monolithic resonator of claim 1 wherein at least one of said facets is convex.

5. The monolithic resonator of claim 1 wherein the material of said block is selected to provide non-linear interaction of optical radiation therewith.

6. The monolithic resonator of claim 1 further including means for changing the resonant frequency of the Gaussian beam supported in said block.

7. The monolithic resonator of claim 6 further including a laser for directing optical radiation having at least one unknown frequency at said coupling means to be fed by the latter into said block, and said means for changing the resonant frequency of the Gaussian beam supported in said block includes means for sweeping said frequency.

8. The monolithic resonator of claim 1 wherein the material of said block is selected to be linear.

9. The monolithic resonator of claim 8 wherein said material is silica.

10. The monolithic resonator of claim 9 wherein said coupling means also is positioned relative to said block to cause radiation that has oscillated within said block as a Gaussian beam to transfer to said coupling means via frustrated total internal reflection for leaving said resonator.

11. A monolithic resonator comprising:
    (a) a one piece polyhedral block of a solid-state medium for resonating optical radiation, which block is adapted to support oscillation of optical radiation as a Gaussian beam and has at least three facets for optically interacting internally of said block with said beam, the material of said block at said facets having an index of refraction selected relative to the index of refraction of the medium within which said facets are to be located to cause total internal reflection of radiation;
    (b) an optical radiation coupler positioned adjacent said polyhedral block so as to cause radiation to enter said block for said oscillation via frustrated total internal reflection; and
    (c) means for changing the frequency of the radiation which resonates in said block.

12. The monolithic resonator of claim 11 further including means for varying the distance between at least one of said facets and said coupler to correspondingly vary the optical coupling therebetween.

13. The monolithic resonator of claim 11 wherein the material of said block is selected to be non-linear.

14. The monolithic resonator of claim 11 wherein the material of said block is selected to be linear.

15. The monolithic resonator of claim 11 wherein said material is silica.

16. The monolithic resonator of claim 15 wherein said body comprises fused silica.

17. The monolithic resonator of claim 11 further including a laser for directing optical radiation having at least one unknown frequency at said coupler to be fed by the latter into said block, and wherein said changing means include means for sweeping the frequency of the radiation which resonates in said block.

18. A spectrum analyzer comprising:
 (a) means for supplying an output beam of optical radiation that includes at least one unknown frequency;
 (b) a one piece polygonal block of a solid-state medium for resonating optical radiation, which block is adapted to support optical radiation as a Gaussian beam therein and has at least three facets for optically interacting internally of said block with said Gaussian beam, the material of said block at said facets having an index of refraction selected relative to the index of refraction of the medium within which said facets are to be located to cause total internal reflection of radiation as a Gaussian beam;
 (c) an optical radiation input/output coupler positioned in the path of said output beam and adjacent said polygonal block so as to cause radiation from said beam to enter said block via frustrated total internal reflection for oscillation therein as a Gaussian beam and to leave said block through said coupler via frustrated total internal reflection;
 (d) means for sweeping the frequency of the optical radiation which can resonate in said block; and
 (e) means for detecting resonance of optical radiation in said block, thereby to indicate said unknown frequency.

19. The spectrum analyzer of claim 18 wherein at least one facet of said block is convex to enhance stability of the resonator modes of said Gaussian beam.

20. The spectrum analyzer of claim 18 wherein said block of a solid-state resonating medium is fused silica.

21. A non-linear optical device comprising:
 (a) means for supplying a beam of optical radiation having a frequency to be converted;
 (b) a one piece polyhedral block of a non-linear solid-state medium for resonating optical radiation, which block is adapted to support oscillation of optical radiation at a frequency associated with the frequency of said beam, as a Gaussian beam and has at least three facets for optically interacting internally of said block with said Gaussian beam, the material of said block at said facets having an index of refraction selected relative to the index of refraction of the medium within which said facets are to be located to cause total internal reflection of radiation within said block as a Gaussian beam; and
 (c) an optical radiation coupler positioned in the path of said Gaussian beam and adjacent said polyhedral block so as to cause radiation from said Gaussian beam to couple with said block via frustrated total internal reflection.

22. The non-linear optical device of claim 21 wherein said block is adapted to support oscillation of optical radiation at said converted frequency as a Gaussian beam.

23. The non-linear optical device of claim 21 wherein said block is adapted to support oscillation of optical radiation as a Gaussian mode at a frequency which interacts with said Gaussian beam.

24. In a method of producing a high Finesse resonator Gaussian beam of optical radiation, the steps of:
 (a) providing a block of a solid state resonating medium, which block is shaped to Support oscillation of optical radiation as a Gaussian beam and has at least three facets for optically interacting internally of said block with said beam; and
 (b) polishing each of said facets to cause total internal reflection thereat of a Gaussian beam within said block when said facets are located within a portion of a medium having a particular index of refraction selected relative to the index of refraction of the material of said block.

25. The method of claim 24 further including the step of providing a convex outward curve on at least one of said facets to enhance the stability of the resonator modes of a Gaussian beam oscillating within said block.

26. The method of claim 24 wherein said step of polishing includes polishing each of said facets to the finish necessary to provide a total scattering loss for a selected frequency of optical radiation within said block that is less than the intrinsic absorption within said block of said frequency.

27. A high Finesse resonator of optical radiation produced by the method of claim 24.

* * * * *